United States Patent [19]

Nerheim

[11] 4,053,897

[45] Oct. 11, 1977

[54] MICROWAVE ELEMENT INCLUDING SOURCE ANTENNA AND CAVITY PORTIONS

[75] Inventor: Eldon Nerheim, Edina, Minn.

[73] Assignee: Honeywell Inc., Minneapolis, Minn.

[21] Appl. No.: 732,263

[22] Filed: Oct. 14, 1976

[51] Int. Cl.² .......................... H01Q 13/00; H03F 1/36

[52] U.S. Cl. ................................ 343/785; 331/107 G; 331/177 V; 343/5 PD; 343/701

[58] Field of Search .......... 331/96, 97, 107 G, 177 V; 340/258 A; 343/5 PD, 701, 702, 785

[56] References Cited

U.S. PATENT DOCUMENTS

| | | | |
|---|---|---|---|
| 2,761,137 | 8/1956 | Van Atta | 343/785 |
| 3,765,021 | 10/1973 | Chiron | 343/785 |
| 3,778,717 | 12/1973 | Okoshi | 331/107 G |
| 3,806,942 | 4/1974 | Preti | 343/702 |
| 3,982,211 | 9/1976 | Enderz | 331/107 G |
| 4,016,506 | 4/1977 | Kofol | 331/107 G |

OTHER PUBLICATIONS

Jacobs; H. et al., *Measurement of Guide Wavelength in Rectangular Dielectric Waveguide,* NY, IEEE, MTT-24, No. 11, pp. 815-820, Nov. 1976.

*Primary Examiner*—Alfred E. Smith
*Assistant Examiner*—Harry Barlow
*Attorney, Agent, or Firm*—Alfred N. Feldman

[57] ABSTRACT

A microwave element is disclosed that is fabricated from a dielectric material wherein the antenna, the iris, and a microwave cavity portion are formed generally from a single piece of relatively high dielectric constant material. The microwave cavity portion is converted into an actual microwave resonant cavity by covering the microwave cavity portion with a conductive material.

15 Claims, 12 Drawing Figures

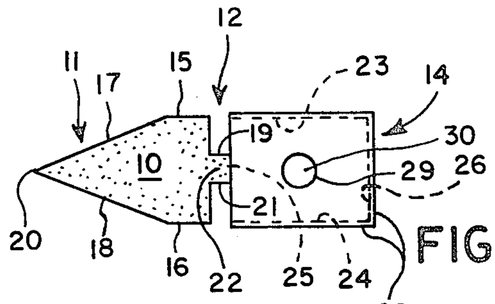
FIG. 1
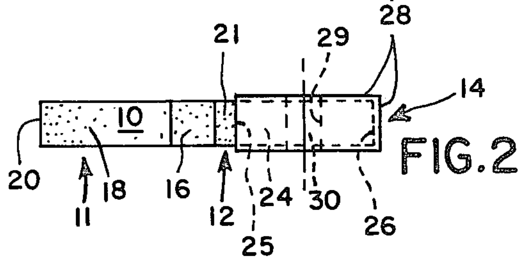
FIG. 2
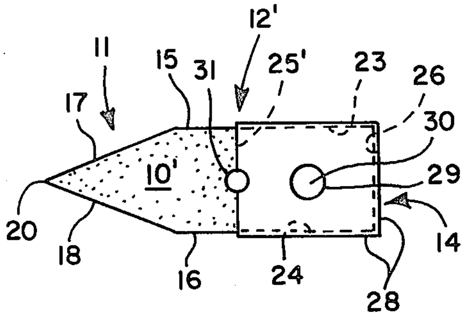
FIG. 3
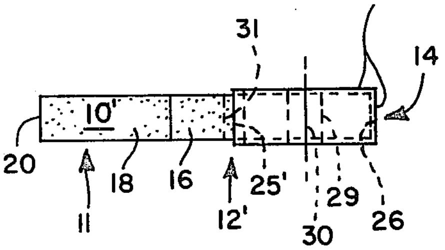
FIG. 4
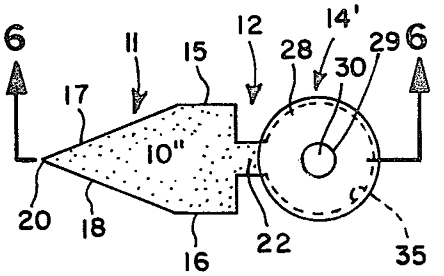
FIG. 5
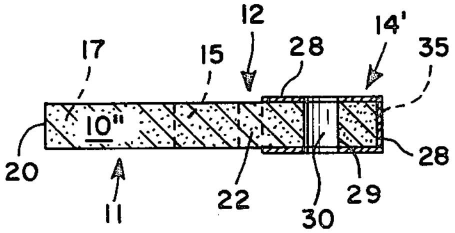
FIG. 6
FIG. 7
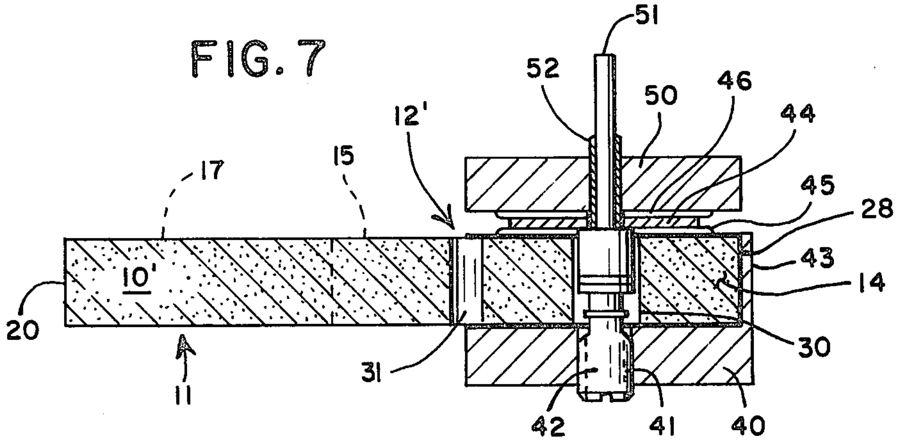

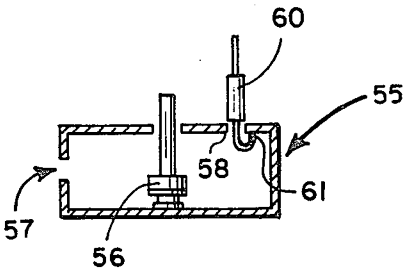
FIG. 9 (PRIOR ART)
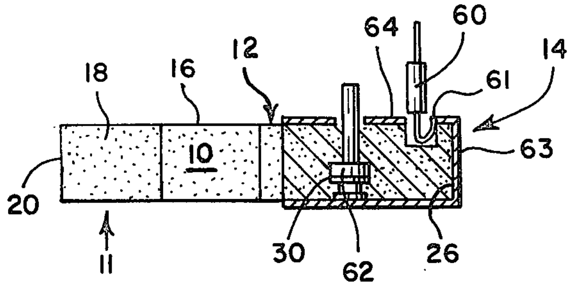
FIG. 10
FIG. 11
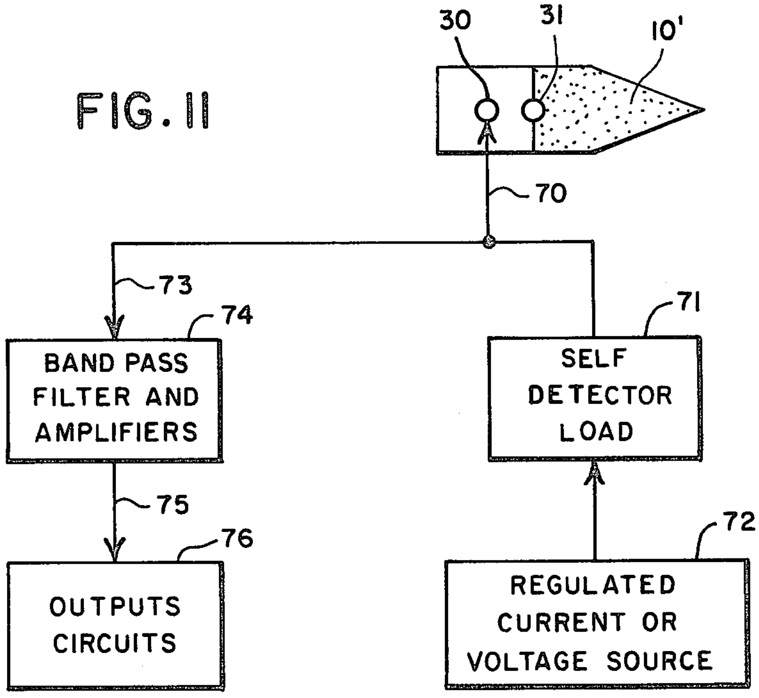

MICROWAVE ELEMENT INCLUDING SOURCE ANTENNA AND CAVITY PORTIONS

BACKGROUND OF THE INVENTION

Small microwave elements have been designed in the past by utilizing a high-Q microwave cavity with an air dielectric by fabricating the cavity as a metallic housing with a microwave source mounted within that cavity. The cavity further normally has an opening that is called an iris. The cavity normally further mounts a metallic, horn-shaped element that acts as the antenna for the device. This type of microwave element can be used in a multitude of applications, such as intrusion detection, proximity sensing, and similar functions. Microwave energy is propagated from the microwave element and the microwave element further uses a Doppler effect and the self-mixing characteristics of the microwave source, or uses the injection of a modulating microwave energy into the microwave cavity from a source separate from the microwave generator for these various applications.

The use of a microwave device of the type just described is limited because of the cost of fabrication of the cavity, iris, and antenna along with the physical size and power requirements of the device itself. In the general class of devices just outlined, the microwave cavity normally supports a Gunn diode, Impatt diode or a Baritt diode, which diodes are known in the art. These diodes are microwave energy sources when properly energized from a direct current source of potential. These devices operate somewhat in the region of 8 to 17 or more gigahertz. In the prior art devices, a Gunn diode, Impatt diode or a Baritt diode is mounted at a one-half wave length location within a high-Q microwave cavity in such a manner that the mounting acts as a series inductance to the high frequency, as well as, simultaneously acting as a capacitance coupling to the walls of the microwave cavity. With this arrangement it is possible to energize the Gunn diode, Impatt diode or the Baritt diode with a relatively low voltage direct current, and cause the diode to oscillate at a microwave frequency. The series inductance blocks the microwave energy from leaving the cavity, while the capacitance element couples the energy to the cavity. The energy is then propagated through the iris to the air horn or antenna where it is radiated into the atmosphere. The design of the device and its air horn determine the antenna pattern. This type of device can either be Doppler operated to measure distance or proximity using the self-mixing characteristics of the energy source, or can be modulated by the injection of additional energy at an appropriate point in the microwave cavity.

This type of device has the disadvantages of size, cost, and the generation of microphonic type noise. The microphonic type noise is a function, to some extent, of the mechanical stress or relative movement of the cavity, iris and air horn. If this structure could be made more rigid, the noise in the system could be reduced.

SUMMARY OF THE INVENTION

The present invention is directed to the fabrication of a high-Q microwave cavity, an iris, and an antenna out of a dielectric means other than air and which normally would be made up of a single piece of material that is substantially uniform in composition. This type of structure is sometimes referred to as a monolithic structure and that term will be used in the present discussion to describe the dielectric material used in the present invention.

In its very simplest form, the present invention is formed of a single piece of high dielectric constant material that can be readily machined. One portion of the material forms the antenna and is in a configuration that continuously reduces in cross section to a sharp point or edge. An iris is formed in the dielectric material by reducing the cross section of the material, for example, by providing a hole through the dielectric material or by providing a pair of slots in the material. For ease of fabrication, the slots are symmetrical. The balance of the structure forms the microwave cavity portion and is completed by having the microwave cavity portion covered with a conductive material. A convenient material would be gold and a convenient method of applying this material to the microwave cavity portion to form an actual microwave resonant cavity would be by plating the gold onto the solid dielectric material. A hole is placed in the center of the microwave cavity portion and provides surface means that are adapted to mount a microwave energy generator such as a Gunn diode, Impatt diode or Baritt diode. With the arrangement thus described, it is possible to fabricate a microwave element having the antenna, iris and microwave resonant cavity as a substantially unitary member of exceedingly small dimensions. This arrangement also provides for a very inexpensive method of manufacture, thereby providing a microwave element that would have many applications, such as proximity sensing or intrusion detection. The specific manner of carrying out the invention and some typical examples of the materials used will be brought out in connection with the description of the preferred embodiments.

BRIEF DESCRIPTION OF THE DRAWINGS

FIG. 1 is a top view of a microwave element;

FIG. 2 is a side view of FIG. 1;

FIG. 3 is a top view of a second version of a microwave element;

FIG. 4 is a side view of FIG. 3;

FIG. 5 is a top view of a further microwave element;

FIG. 6 is a cross section of the element of FIG. 5 taken along line 6—6;

FIG. 7 is a cross section of a microwave element showing the mounting of a diode in the microwave cavity;

FIG. 9 is a partial cross section of a prior art device;

FIG. 10 is a partial cross section of a microwave element showing the introduction of a modulation signal;

FIG. 11 is a block diagram of the invention used in a system without modulation, and;

DESCRIPTION OF THE PREFERRED EMBODIMENTS

Figure 8:
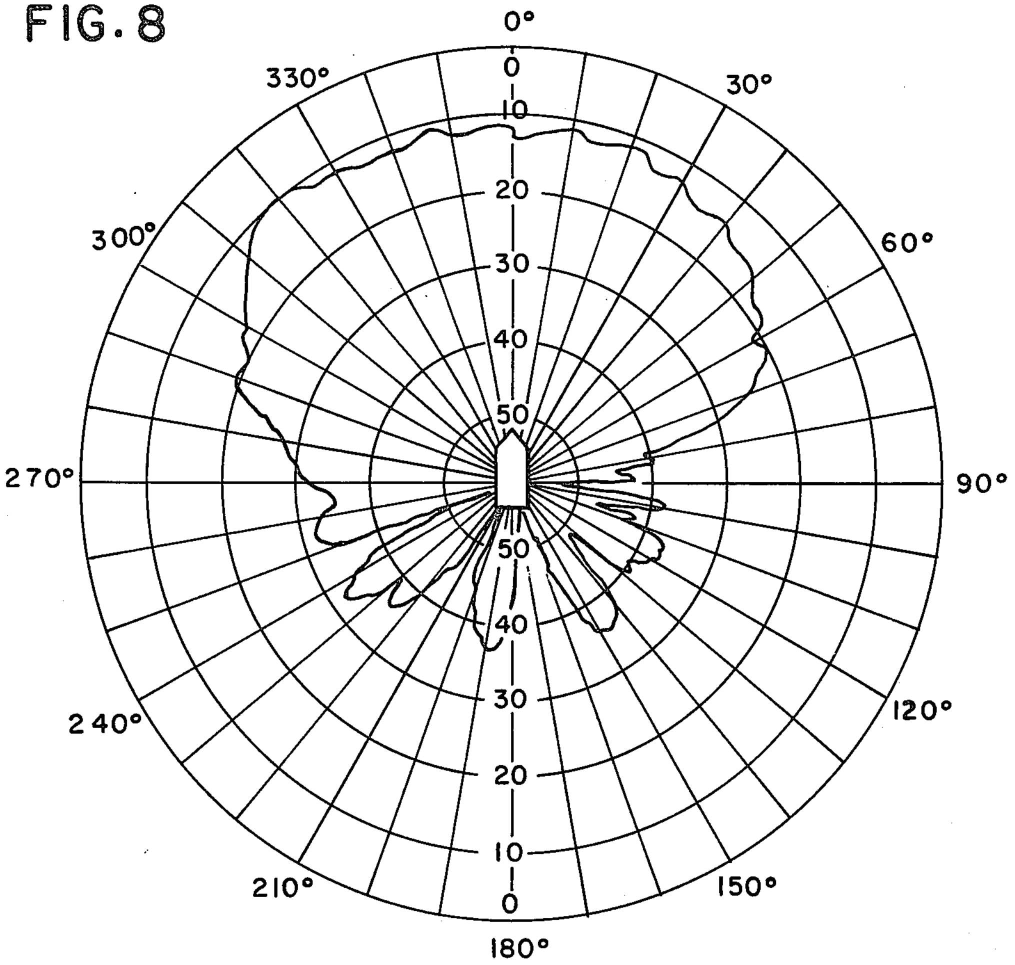
FIG. 8 is a polar graph of a typical antenna pattern generated by one model of the novel microwave element.

In FIGS. 1 and 2 there is disclosed a first microwave element generally disclosed at 10 and which includes an antenna portion 11, an iris 12, and a microwave cavity portion 14. The disclosed microwave element 10, in the configuration disclosed in FIGS. 1 and 2, is fabricated from a single piece of material that is substantially uniform in composition and generally will be referred to as a monolithic dielectric means or material. Microwave elements of the type disclosed at 10 have been manufactured from such high dielectric constant materials as Stycast HiK and Beryllium oxide. These two high dielectric constant materials have a dielectric constant of approximately six as opposed to the dielectric constant of one for air. These materials are referred to sometimes as ceramics. The Stycast HiK material is capable of being machined without any great difficulty. The Beryllium oxide material is formed in the soft green state. The present invention can be carried out with any type of dielectric means but are preferably made using a relatively high dielectric constant material. In connection with the description of the various embodiments, for simplicity sake, the material will simply be referred to as a monolithic dielectric material.

The microwave element 10 is basically flat in height, thereby yielding a rectangular cross section at any point in its length. The antenna portion 11 has a pair of parallel sides 15 and 16 extending from the iris 12 towards a pair of tapered sides 17 and 18. The two tapered sides 17 and 18 converge to a tip or edge 20 so that it becomes apparent that the antenna portion 11 has a reduced cross section opposite from the iris 12 and that this reduced cross section terminates in a continuously diminishing configuration in the form of a sharp edge 20. As will be noted in FIG. 2, the thickness or height of the microwave element 10 remains substantially constant throughout its length.

The iris 12 is formed by reducing the cross section of the microwave element 10 at surfaces 19 and 21. In forming the iris 12, the two surfaces 19 and 21 are provided as part of a pair of symmetrically dimension slots through the dielectric material between the antenna portion 11 and the cavity portion 14. The slots have been shown as symmetrical, but they could be of different sizes, or could be a single slot. The iris 12 in fact becomes the bridging portion 22 between the antenna portion 11 and the microwave cavity portion 14.

The microwave cavity portion 14 is formed of a continuous portion of the dielectric material and has two outer edges 23 and 24 which correspond in width with the sides 15 and 16 of the antenna portion 11. The cavity portion 14 has an effective wall portion 25 adjacent the iris 12 that extends between edges 23 and 24, and a wall portion 26 opposite the first wall portion 25 which also forms the rear wall of the microwave cavity portion 14. The space between the wall portions 25 and 26 equals the wave length, in the dielectric, of the frequency for which the microwave element is designed to be operated.

Centered in the microwave cavity portion 14 is a hole 30. The hole or opening 30 has surface means 29 which define an opening which is adapted to mount a microwave energy generating means such an an Impatt diode, Baritt diode, or a Gunn diode, depending on the frequency and use to which the element is to be put. A method of mounting the diode in the opening 30 will be described in connection with FIG. 7, but it must be understood that the particular type of microwave generating means provided for the present microwave element is not material to the invention, but has been disclosed to completely explain the fabrication and operation of the device.

The microwave element 10 is completed by covering the microwave cavity portion 14 with a coating of conductive material to thereby create a microwave resonant cavity means. The coating may also cover part of the wall portion 25. The coating has been disclosed in the drawings as heavy lines as at 28. The coating 28 can be any conductive coating but in a preferred embodiment would be a gold plating on the microwave cavity portion 14 to thereby provide the necessary resonant cavity for the microwave energy.

As can be seen in FIGS. 1 and 2, an exceedingly simple monolithic microwave element has been provided which in a single structure provides not only the antenna, the iris, but also the microwave resonant cavity. In units fabricated for the use with Gunn diodes, and utilizing Stycast HiK and Beryllium oxide as the monolithic dielectric material, a total microwave element length of approximately 1.205 inches has been used with an element that is 0.163 inches high and 0.367 inches wide. These devices operate at approximately 11.4 gigahertz and 14.3 gigahertz respectively.

In FIGS. 3 and 4 a second microwave element 10′ has been disclosed having an antenna portion 11, an iris 12′ and a microwave cavity portion 14. Once again, flat surfaces 15 and 16 are provided along with tapered sides 17 and 18 to an edge 20. In this particular version, the iris 12′ is formed by providing a reduced cross section in the form of a hole 31 which creates an effective wall portion 25′ that coincides with the center of hole 31. A rear wall portion 26 is provided along with a center hole 30 which has surface means 29 for mounting the source of microwave energy. The physical size of the element is substantially the same as that disclosed in FIGS. 1 and 2 and the balance of the surfaces and described portions remain the same. In the microwave element disclosed in FIGS. 3 and 4, the microwave resonant cavity again has been disclosed as heavy line 28 to indicate the location of the plated or conductive material that has been applied to the monolithic dielectric material that forms the body of the microwave element.

In FIGS. 5 and 6 a further version of the microwave element has been disclosed as 10″ with an antenna portion 11, an iris 12, and a microwave cavity portion 14′. In this particular version the microwave cavity portion 14′ is annular in shape having a radial surface 35 which defines both the wall portion adjacent the iris and the wall portion opposite the iris in forming the microwave cavity portion 14′. The mounting hole 30 is again provided with surfaces 29 and the coating or plating that is shown as a heavy line 28 on the annular portion 14′.

In considering the three structures just described, it becomes apparent that a number of configurations are possible within the present inventive concept. It would also be possible to manufacture a microwave element of a tubular configuration with the antenna portion 11 continuously diminished in configuration to a point, and the iris 12 created by either providing a hole as is disclosed in FIGS. 3 and 4, or by cutting an annular groove around the tubular member as would compare to the version disclosed in FIGS. 1 and 2. An opening would be provided in the cavity portion 14 for mounting a source of microwave energy and the cavity portion would be again covered with a conductive material to form the actual resonant cavity.

As can be seen, the present arrangement utilizing a high dielectric constant solid material that can be machined and is monolithic in structure provides a very simple method of fabricating a microwave element that can be used for the manufacture of an exceedingly small sensor for use as a proximity device, an intrusion detection, or similar type of unit. As will be seen in connection with subsequent figures, methods of operating the microwave element, which are all known in the art, provide the microwave element with the capability of being used as a Doppler effect device using a self-mixing technique or with a modulated input for distance measurement as has been done with other microwave elements.

In FIG. 7 a microwave element of this type disclosed in FIGS. 3 and 4 is shown with a means for mounting a microwave energy generating means. The microwave element 10' having the sharp edge 20 and a tapered wall along with the hole 31 that forms the iris 12' for the device is disclosed. A metal support or cavity 40 is provided with a threaded opening 41 that mounts the microwave energy generating means 42, which has been disclosed as a Gunn diode. The support 40 has a rear wall 43. The Gunn diode 42 is threaded at 41 into the support 40 and projects up through the opening 30 in the microwave cavity portion 14 of the microwave element. A copper disc 44 is mounted between two Mylar washers 45 and 46 which are in turn held in place by a disc 50. These three elements have been shown in enlarged size for the sake of clarity. The disc 50 is isolated from the Gunn diode terminal 51 by a layer of Mylar tape 52. With the arrangements thus disclosed the two terminals of a Gunn diode 42 are provided properly mounted in the microwave element 10' so that the device is capable of generating and propagating microwave energy.

In FIG. 8 there is disclosed a typical antenna pattern plotted in a convention polar coordinate graph of a microwave element utilizing the monolithic dielectric means of the present invention. It will be noted that the antenna pattern disclosed has a concentration of the radiated energy in approximately the front 90° of the microwave antenna, as defined by normal antenna measuring techniques.

In order to make the present device usable both in Doppler measuring techniques and in modulated techniques, it is necessary to provide some way of introducing modulated energy. In FIG. 9 a prior art air cavity type unit mounting a microwave diode is disclosed. A resonant air cavity for microwave energy is disclosed at 55 in cross section. At the center of the resonant cavity 55 is mounted a Gunn diode 56 and the cavity has an air iris 57. An opening 58 is provided in the top of the wall of the microwave cavity 55 into which is inserted a Varactor or hot carrier diode 60 which is connected at 61 to the wall of the microwave resonant cavity. This prior art device shows how a Varactor or hot carrier diode 60 can be introduced into a microwave resonant cavity for the addition of modulation.

In FIG. 10 a partial cross section of the present invention wherein a microwave element 10 similar to that disclosed in FIGS. 1 and 2 is provided. A microwave energy source 62 is mounted in the opening 30 in the microwave element 10 as has been previously described. In this view, the plating or covering material of metal on the cavity portion 14 to form the resonant microwave cavity means is disclosed at 63. A second opening 64 is provided in the microwave cavity portion 14 so that a Varactor or hot carrier diode 60 can be mounted so that it is connected at 61 to the metallic covering 63 to introduce a modulation signal in the same fashion as is done in connection with the prior art device disclosed in FIG. 9. It has been found that by placing the second opening 64 midway between the opening 30 and the rear wall 26 of the microwave element 10, that satisfactory modulation energy can be added to the resonant cavity to modulate the microwave element output.

In FIG. 11 a schematic representation of a microwave element 10' is disclosed having the opening 31 which forms an iris and the opening 30 for mounting the necessary source of microwave energy. In this particular version, a circuit 70 that is energized from a self-detector load 71 and a regulated current or voltage source 72 is provided. Since the present devices are known to have a self-mixing characteristic, this self-mixing characteristic is taken advantage of by connecting the circuit 70 to a circuit 73 that feeds a return signal coming back to the microwave element 10' to a band pass filter and amplifier 74 which in turn is connected to circuit 75 which feeds to an output circuit 76. The disclosure of FIG. 11 merely illustrates how this device can be used without modulation.

Figure 12:
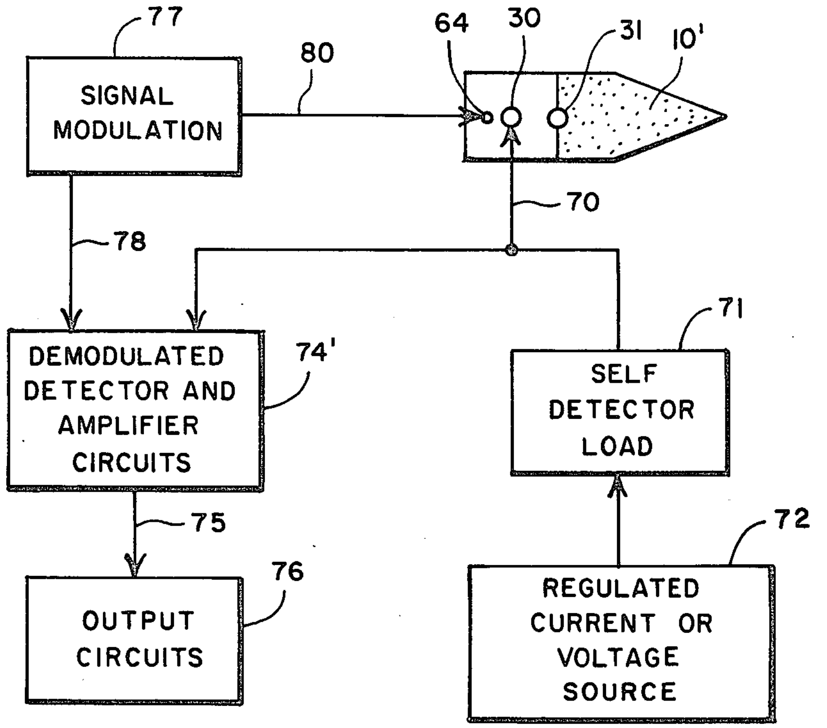
FIG. 12 is a block diagram of the invention used in a system with modulation.

In FIG. 12 the same arrangement as FIG. 11 is disclosed but the addition of a modulation signal is provided. The microwave element 10' and the iris opening 31 is disclosed along with the diode mounting hole 30, and the second opening 64 for the Varactor or hot carrier diode. The circuitry of FIG 12 is similar to that of FIG. 11 except for the addition of a signal modulator 77 which is connected back at 78 to a demodulator, detector and amplifier circuit 74' and is also connected at 80 to the Varactor or hot carrier diode 60 in the opening 64.

In FIG. 12 the circuitry also includes a self-detector load 71 and a regulated current or voltage source 72 providing power. This input is provided via circuit 70 to the microwave element 10' along with signal modulation power via circuit 80 to the Varactor or hot carrier diode which would be in the opening 64. The signal modulation from 77 is fed both to the microwave element 10' and to the demodulator, detector and amplifier circuit 74' which in turn provides an output via circuit 75 to the output circuit 76.

The operating methods disclosed in FIGS. 11 and 12 are not considered part of the present invention but have been disclosed merely to show how the present device, in the form of the microwave element itself, could be applied to various applications that are known in the art.

The present invention can be carried out by the use of various materials having different dielectric constants and different geometric shapes. The size, type of material, and shape of the microwave element will vary with the type of microwave energy source being used and the type of beam width desired from the particular element. In the elements disclosed in FIGS. 1 through 6, the tapered walls 17 and 18 of the antenna portion can be varied to change the beam width of the radiated pattern. It has been found that the longer the taper, the narrower the antenna radiation beam becomes. As has been disclosed, the manner in which the cross section is varied in order to obtain the iris of the present element can vary but is basically dependent on reducing or changing the cross section of the microwave element portion between the antenna portion and the microwave cavity portion. The microwave cavity portion itself can take on different geometric configurations, such as rectangular, angular, or circular depending on the application and the type of microwave energy source. Also the cavity portion can be converted into a resonant cavity means by applying a metallic covering by any convenient method such as plating, coating, vacuum depositing, or any other convenient means.

Due to the rigid structure of the monolithic microwave element, the element has little or no tendency to be distorted if the element is in a moving body. This rigidity provides a microwave element that has a low noise characteristic as compared to noise created by the movement or flexure of a conventional air type of microwave antenna and its components. Probably one of the major advantages of the present invention is the miniaturization of conventional microwave technology by utilizing materials that have dielectric constants that are substantially higher than air. This allows for a structure to be substantially smaller than an air dielectric microwave element and further provides for the direct mounting of the microwave energy generating means directly upon or within the microwave element without difficulty.

The present invention obviously can be carried out in a number of types of materials, using different configurations, and different techniques for forming the actual microwave resonant itself. For this reason the applicant wishes to be limited in scope solely by the appended claims.

The embodiments of the invention in which an exclusive property or right is claimed are defined as follows:

1. A microwave element, including: dielectric means including an antenna portion, an iris formed as a reduced cross section in said dielectric means, and a microwave cavity portion; said antenna portion of said dielectric means having a reduced cross section opposite said iris with said reduced cross section terminating in a continuously diminishing configuration; said microwave cavity portion being covered with a conductive material to create microwave resonant cavity means; said microwave cavity means further including an opening midway between an effective first wall portion adjacent said iris and a cavity wall portion opposite said first portion; and surface means defining said opening with said surface means adapted to receive microwave energy generator means in said opening for the generation of microwave energy in said cavity means that is propagated through said iris and radiated from said antenna portion of said microwave element.

2. A microwave element as described in claim 1 wherein said dielectric means is formed of solid dielectric material.

3. A microwave element as described in claim 2 wherein said dielectric material is a unitary, monolithic dielectric material.

4. A microwave element as described in claim 3 wherein said monolithic dielectric material is a flat dielectric material having a generally rectangular cross section.

5. A microwave element as described in claim 4 wherein said conductive material that covers said microwave cavity portion is a thin coating which relies solely upon said microwave cavity portion of said dielectric material for the mechanical support of said conductive material.

6. A microwave element as described in claim 5 wherein said reduced cross section of said antenna portion includes a tapered configuration which diminishes to an edge with a height equal to the thickness of said flat dielectric material.

7. A microwave element as described in claim 6 wherein said iris is formed by providing a hole through said dielectric material to reduce the cross section of said dielectric material.

8. A microwave element as described in claim 6 wherein said iris is formed by providing slot means through said dielectric material between said antenna portion and said cavity portion to provide said reduced cross section.

9. A microwave element as described in claim 6 wherein said iris is formed by said slot means being a pair of slots through said dielectric material between said antenna portion and said cavity portion to provide said reduced cross section.

10. A microwave element as described in claim 9 wherein said slots are symmetrically dimensioned.

11. A microwave element as described in claim 10 wherein said microwave cavity means is annular in shape.

12. A microwave element as described in claim 1 wherein said microwave cavity means includes a second opening in said cavity means with said second opening having surface means adapted to receive modulation signal means for the introduction of modulation energy into said cavity means.

13. A microwave element as described in claim 12 wherein said second opening is located between said first opening and said cavity wall portion opposite said first wall portion.

14. A microwave element as described in claim 7 wherein said microwave cavity means includes a second opening in said cavity means with said second opening having surface means adapted to receive modulation signal means for the introduction of modulation energy into said cavity means.

15. A microwave element as described in claim 8 wherein said microwave cavity means includes a second opening in said cavity means with said second opening having surface means adapted to receive modulation signal means for the introduction of modulation energy into said cavity means.

* * * * *